United States Patent [19]

Hu et al.

[11] Patent Number: 4,744,859

[45] Date of Patent: May 17, 1988

[54] PROCESS FOR FABRICATING LIGHTLY DOPED DRAIN MOS DEVICES

[75] Inventors: Yaw W. Hu, Cupertino; Charles C. C. Kau, San Jose, both of Calif.

[73] Assignee: Vitelic Corporation, San Jose, Calif.

[21] Appl. No.: 922,509

[22] Filed: Oct. 23, 1986

[51] Int. Cl.$^4$ .................. H01L 21/306; B44C 1/22; C03C 15/00; C03C 25/06

[52] U.S. Cl. .................. 156/643; 156/646; 156/653; 156/657; 156/656; 156/659.1; 156/662; 437/29; 437/34; 437/41; 437/154

[58] Field of Search ............... 156/643, 646, 653, 657, 156/656, 659.1, 662; 204/192.32, 192.37; 427/38, 39; 437/27–29, 34, 40, 41, 56, 57, 58, 59, 154, 158, 228, 233, 235; 148/DIG. 53, DIG. 141; 357/23.1, 23.11, 42, 44, 59, 67, 71

[56] References Cited

U.S. PATENT DOCUMENTS

| | | | |
|---|---|---|---|
| 4,356,623 | 11/1982 | Hunter | 437/41 X |
| 4,512,073 | 4/1985 | Hsu | 437/41 X |
| 4,577,392 | 3/1986 | Peterson | 156/653 X |
| 4,597,824 | 7/1986 | Shinada et al. | 156/657 X |
| 4,616,399 | 10/1986 | Ooka | 437/41 X |
| 4,642,878 | 2/1987 | Maeda | 437/34 |
| 4,658,496 | 4/1987 | Beinvogl et al. | 437/34 |

Primary Examiner—William A. Powell
Attorney, Agent, or Firm—Townsend and Townsend

[57] ABSTRACT

A process is disclosed for fabricating a lightly doped drain field effect transistor structure. The process includes the steps of forming a first layer of insulating material 25 on a P type substrate 10. A gate electrode which includes a polysilicon portion 28 and a metal silicide portion 30 is formed on the gate oxide 25. An etch resistant layer 36 is deposited across the structure, typically on an underlying layer of silicon dioxide 27, to protect the structure from subsequent reactive ion etching. On the etch resistant layer 36, an etchable layer of material 42 is deposited and defined into spacer regions 44. The spacer regions 44, in conjunction with the gate electrode 32, define a mask for the implantation of source and drain regions. The lightly doped portions of the source and drain regions are then formed by introducing a second impurity of different diffusivity, and allowing the higher diffusivity impurity to diffuse out from the source/drain regions 48, or by removing the spacer regions 44 before a second implant to form the lightly doped regions 54.

16 Claims, 2 Drawing Sheets

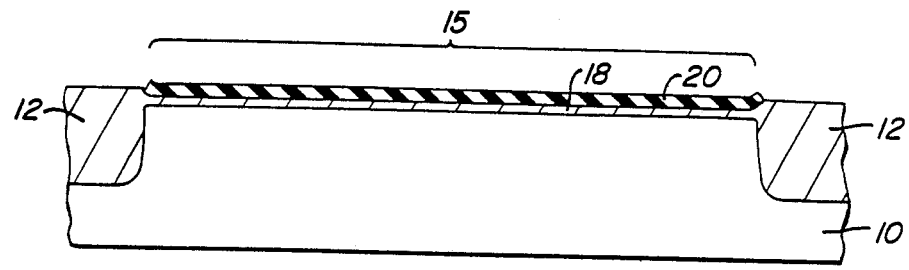
FIG._1.
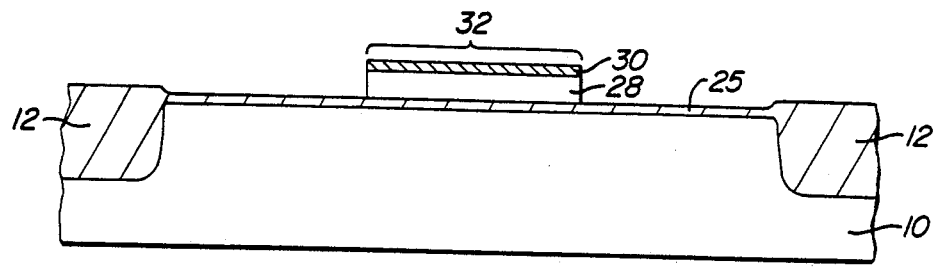
FIG._2.
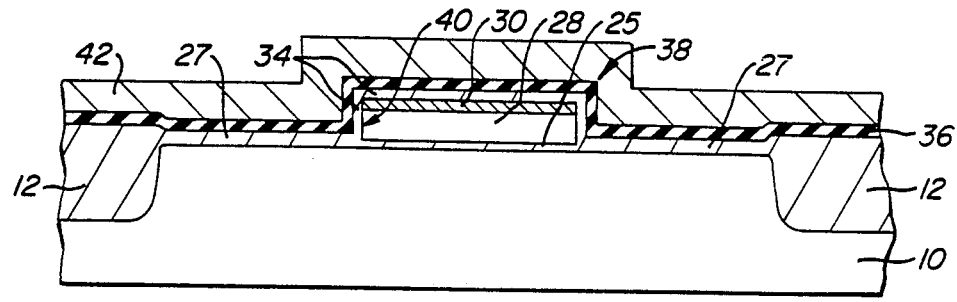
FIG._3.
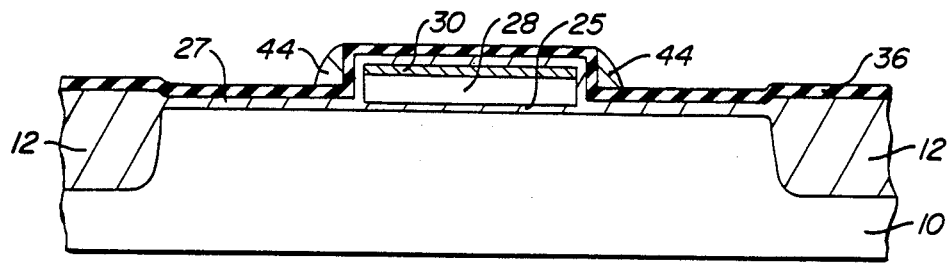
FIG._4.

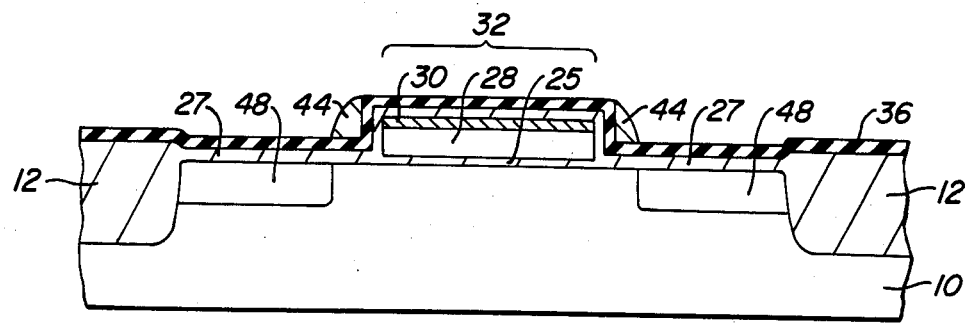
FIG._5.
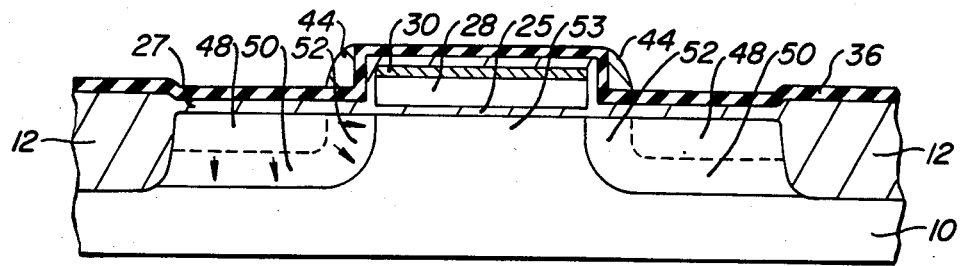
FIG._6a.
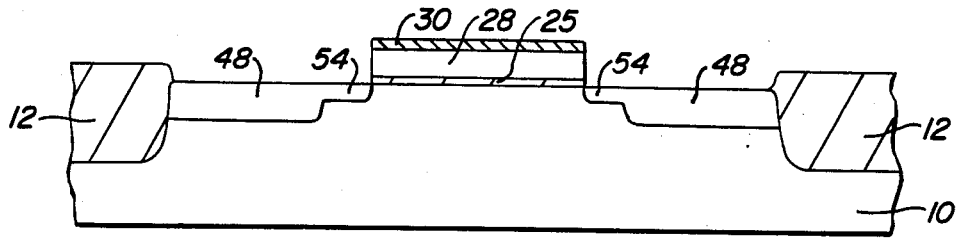
FIG._6b.

PROCESS FOR FABRICATING LIGHTLY DOPED DRAIN MOS DEVICES

BACKGROUND OF THE INVENTION

1. Field of the Invention

This invention relates to processes for fabricating integrated circuits. In particular, the invention involves processes for fabricating MOS or CMOS integrated circuits having a lightly doped drain structure, in which a portion of the source and drain nearest the channel is less strongly doped than other regions of the source and drain.

2. DESCRIPTION OF THE PRIOR ART

Numerous processes are known for the fabrication of MOS or CMOS integrated circuits, for example, self-aligned processes employing polycrystalline silicon gates. Also well known are field effect transistors having "lightly doped drains." In such structures, regions of the source and drain near the channel beneath the gate electrode are less heavily doped than regions of the source and drain further away from the channel. The lower doping near the gate electrode improves the speed and reliability of the device while preventing punch-through. The lighter doping also lowers the gate-source and gate-drain capacitance, and minimizes hot electron injection into the gate.

Unfortunately, lightly doped drain structures typically require additional processing beyond that required for conventional field effect devices such as polysilicon gate MOS structures. In a conventional MOS process, a thin layer of gate oxide is fabricated on a silicon substrate, and an electrode defined on the gate oxide. The electrode is used as a mask for the implantation of the source and drain impurities, which during the same process dope the electrode to lower its resistance. Such conventional MOS processes may also be employed in complementary structures, and have the advantage of being self-aligned. Self-alignment results from using the electrode to define the source and drain regions, thereby assuring that they are properly aligned with the gate electrode without additional masks and their resulting alignment tolerances.

A significant disadvantage of prior art processes for forming lightly doped drain MOS structures is that many such processes require additional masking. For example, in one process the gate is masked with a layer slightly larger than the gate to protect regions of the silicon adjacent the gate electrode. Regions of the silicon further out are then doped with a first process and the mask removed to allow a lighter doping of the regions nearer the gate with a second process.

In another well known lightly doped drain process, a region of silicon dioxide is formed as a spacer along the sides of the gate electrode, and then the silicon heavily doped. The oxide is removed and the thereby exposed regions near the gate, as well as regions further from the gate, then are lightly doped with a second process. Unfortunately, when a metal silicide gate is used, such spacer oxide processes are difficult to control because silicon dioxide on the gate is damaged during the implant so that it will etch as fast as the spacer oxide etches, resulting in its removal from the gate. When the structure is again heated, the silicide will oxidize and corrugate, lowering yields.

SUMMARY OF THE INVENTION

We have developed a process for fabricating lightly doped drain field effect transistors which overcomes the disadvantages of prior art processes. Our process allows the fabrication of such devices in a self-aligned manner while preventing damage to the underlying structure, yet enabling easy removal of the spacer oxide used to define the lightly doped region.

In a preferred embodiment our process of fabricating a field effect transistor includes the steps of forming a first layer of insulating material on a first conductivity type semiconductor substrate, then defining a gate electrode on the first layer of insulating material. The gate electrode includes an upper surface which is bounded by edges. Once the gate electrode is defined, an etch resistant layer, preferably silicon nitride or silicon oxynitride, is deposited over the gate electrode and over the first layer of insulating material. The etch resistant layer includes edges which conform to the edges of the gate electrode. Next, an etchable layer of material is deposited over the etch resistant layer, and the etchable layer is removed from all of the etch resistant layer except for spacer regions adjacent the edges of the etch resistant layer, and therefore adjacent the edges of the gate electrode. Finally, using the gate electrode and the spacer regions as a mask, impurity of second conductivity type is introduced into the substrate to define spaced-apart source and drain regions.

In one embodiment of our invention, this step is followed by a step of introducing another second conductivity type impurity, preferably of higher diffusivity, into the source and drain regions. This second implant provides the lightly doped areas adjacent the gate electrode when it diffuses outward during annealing. In another embodiment of our invention, the spacer oxide is removed to allow a blanket implant of second conductivity type into the source and drain regions to provide the lightly doped regions.

BRIEF DESCRIPTION OF THE DRAWINGS

FIG. 1 is a cross-sectional view of the semiconductor structure including field regions and an overlying mask which includes layers of silicon dioxide and silicon nitride;

FIG. 2 is a cross-sectional view after formation of a layer of gate oxide and a polycrystalline silicon and metal silicide gate electrode;

FIG. 3 is a cross-sectional view after formation of an overlying etch resistant layer, and deposition of etchable material;

FIG. 4 is a subsequent cross-sectional view after formation of spacer regions for the lightly doped drain structure;

FIG. 5 is a cross-sectional view after implantation of the source and drain regions;

FIG. 6a is a subsequent cross-sectional view after introduction of a second impurity into the source and drain regions according to a first embodiment of the invention; and FIG. 6b is a subsequent cross-sectional view after removal of the spacers and implantation of additional second conductivity type impurity according to an alternate embodiment of the invention.

DETAILED DESCRIPTION OF THE PREFERRED EMBODIMENTS

FIG. 1 is a cross-sectional view of a semiconductor structure fabricated using well known semiconductor process operations. The structure shown in FIG. 1 includes a monocrystalline silicon body 10 doped with boron to the desired resistivity. Recessed into the surface of silicon 10 is a field oxide region 12 which surrounds a central portion 15 to isolate it electrically from surrounding regions of substrate 10. As will be described, our process is employed to form a field effect transistor in region 15. If a complementary field effect transistor structure is to be formed, than additional regions such as region 15, except doped N-type, will be fabricated in other areas of the substrate for complementary type devices.

The field oxide 12 is fabricated using a well known process in which an underlying layer of silicon dioxide 18 is formed across the upper surface of substrate 10 by thermal oxidation, and then an overlying layer 20 of silicon nitride is deposited using chemical vapor deposition. In the preferred embodiment, silicon dioxide 18 is approximately 200–400 Angstroms thick, while silicon nitride 20 is about 1000 Angstroms thick. The field oxide region 12 typically is formed by covering all of substrate 10 with masking layers 18 and 20, then removing at least layer 20 from regions where field oxide 12 is desired. The structure then is placed in a furnace and heated to create field oxide regions 12 approximately 6000–10000 Angstroms thick.

After fabrication of field oxide 12, the silicon dioxide 18 and silicon nitride 20 are removed from the surface of the structure and a new relatively thin layer of silicon dioxide 25 is formed. Silicon dioxide 25 is the insulating material used to separate the gate electrode from the substrate. In the preferred embodiment, silicon dioxide 25 is approximately 200–400 Angstroms thick and is formed by heating the substrate in an oxygen ambient to a temperature of 900°–1000° C. for 20–100 minutes. Gate oxide 25 is shown in FIG. 2.

Across the upper surface of gate oxide 25 a layer of polycrystalline silicon 28 approximately 2000–4000 Angstroms thick is deposited, preferably using chemical vapor deposition. On the upper surface of polysilicon 28, a layer of metal silicide 30 approximately 1000–3000 Angstroms thick is deposited, also using chemical vapor deposition. Although many different metal silicides may be used, we prefer tungsten silicide because of its resistance to subsequent high temperature processing.

Next, using well known photolithographic techniques, the layers of metal silicide 30 and polysilicon 28 are masked, for example, using photoresist. Undesired portions of the layers are removed as shown in FIG. 2. Layers 30 and 28 may be removed from undesired regions using well known chemical or plasma etching processes. Etchants are typically employed which do not attack silicon dioxide 25 (or etch the silicon dioxide at a slow rate), thereby allowing it to function as an etch stop for the process. In the preferred embodiment, the gate electrode 32 will divide the silicon device area 15 into two spaced-apart regions by extending completely across the silicon device area 15 and up onto the field oxide behind the cross-section shown in FIG. 2.

After formation of the gate electrode 32, which comprises the layers of metal silicide 30 and polysilicon 28, the structure is again oxidized by heating it in an oxygen ambient at 900°–100020 C. for 20–100 minutes. During this process, the silicon dioxide 25 beneath the gate will be protected, while the surrounding silicon dioxide 27 will become slightly thicker. Additionally, some of the silicon in the tungsten silicide layer 30, or silicon diffused from the underlying polysilicon layer, will oxidize, as will the sides of the polycrystalline silicon 28 to form a new silicon dioxide layer 34 200–1000 Angstroms thick across the sides and upper surface of the gate electrode. Next, as also shown in FIG. 3, a layer of silicon nitride or oxynitride 36 is deposited across oxide 27 and 34 in the manner depicted. Silicon nitride 36 typically will be 200–600 Angstroms thick and formed using chemical vapor deposition. The edges of silicon nitride 38 will generally correspond to the sides 40 of the electrode. Then, as also shown in FIG. 3, a relatively thick layer of silicon dioxide 42 is deposited using chemical vapor deposition across the upper surface of silicon nitride 38. Silicon dioxide 42 may be doped or undoped and will be about 2000–5000 Angstroms thick.

FIG. 4 illustrates the next step of the process. An unmasked anisotropic etch is used to remove almost all of silicon dioxide layer 42 from the surface of silicon nitride 36. Because of the substantially greater thickness of silicon dioxide 42 at the outside edges 38 of nitride 36, the etching process may be carried out for a time sufficient to remove silicon dioxide from 42 from all of the surface except for a pair of spacer regions 44. (Of course, if the etching process is allowed to continue, the spacer regions will be removed.) In a preferred embodiment, the anisotropic etch comprises etching with a plasma containing a mixture of $C_2F_6$, $CHF_3$, oxygen and inert gases. Such a plasma will not significantly attack silicon nitride 36, thereby allowing complete removal of the oxide, except for the spacer regions 44, without damaging the underlying structure. Additionally, the nitride provides a good end point for the etching, allowing stopping the process properly. This aspect of our process provides a unique advantage over prior art processes. In the prior art, the upper surface of the gate 32 would be exposed by the etching and then would corrugate during subsequent processes.

Once the spacer regions 44 are complete, arsenic is implanted through the silicon nitride 36 and silicon dioxide 27 to form the source and drain regions 48. The arsenic is prevented from reaching the substrate 10 elsewhere by the spacer regions 44 and the gate electrode 32, which includes silicide 30 and polysilicon 28. The implanted regions 48 will form the heavily doped portion of the source/drain regions, typically about $10^{15}$ atoms per square centimeter at the upper surface. At this stage of the process, either of two alternatives may be employed to complete fabrication of the lightly doped portion of the source/drain regions by introduction of additional impurity. A first embodiment is shown in FIG. 6a, and a second in FIG. 6b.

Following the heavy implantation described in conjunction with FIG. 5, a lighter implantation of N conductivity type impurity having a higher diffusivity is employed, for example, as shown in FIG. 6a. In this embodiment, approximately $10^{13}$ atoms per square centimeter of phosphorus are implanted, again using the spacers 44 and gate electrode 32 to mask the impurity. Although the impurity therefore will be introduced only into regions 48, during later processing steps, for example, annealing of the implant, the phosphorus, with its higher diffusivity, will diffuse out from region 48, extending deeper into the substrate 10 as well as closer to the gate electrode 30. This out-diffusion is indicated by the arrows and expanded portion 50 of regions 48. For clarity, out-diffusion is shown in an exaggerated manner in FIG. 6a. The lightly doped portion 52 of each of the source and drains separates the heavily doped portion 48 from the channel 53. Of course, in this embodiment of our invention, the phosphorus could be implanted before the arsenic, if desired.

A second embodiment of the process of our invention is shown in FIG. 6b. This structure is achieved from that depicted in FIG. 5 by removing the spacer regions 44 before implanting additional impurity into the substrate 10. The spacer regions 44 may be removed by dipping the structure in hydrofluoric acid and then lightly implanting phosphorus or arsenic implant to thereby create the lightly doped regions 54. By virtue of the self-aligned process, additional impurity will also be introduced into regions 48 during the same process. In FIG. 6b, both layers 36 and 27 have been removed. These layers may be removed before the light implant, if a low dose implant is desired, or allowed to remain in place if a higher dose implant is desired. Furthermore, by use of selective etchants such as phosphoric acid, oxide layer 27 may be left in place and only nitride layer 36 removed, or the nitride may be left in place.

At this stage, the transistor will be completely using well known processes. For example, the structure may be reoxidized and contact openings made to the gate, source and drain. Then metal, metal silicide, or polysilicon contacts will be formed to provide electrical connections.

The foregoing has been a description of two embodiments of the process of our invention. It should be understood that specific details regarding the implementation of our process have been described to enable a complete understanding of our process. Such details are not intended to limit the process, whose scope may be ascertained from the appended claims.

We claim:

1. A method for fabricating a field effect transistor comprising:
    forming a first layer of insulating material on a first conductivity type semiconductor substrate;
    defining a gate electrode on the first layer, the gate electrode having an upper surface bounded by edges protruding above the first layer;
    depositing an etch resistant layer over the gate electrode and over the first layer, the etch resistant layer having edges conforming to the edges of the gate electrode;
    depositing an etchable layer of material over the etch resistant layer;
    removing the etchable layer from the etch resistant layer except for spacer regions disposed adjacent the edges of the etch resistant layer; and
    using the gate electrode and the spacer regions of the etchable layer as a mask, introducing first impurity of second conductivity type into the substrate to define spaced apart source and drain regions.

2. A method as in claim 1 wherein, following the step of using the gate electrode, a step is performed comprising:
    also using the gate electrode and the spacer regions as a mask, introducing second impurity of second conductivity type into the source and drain regions.

3. A method as in claim 2 wherein the first and second impurity have different diffusivities to allow one of the first and second impurities to diffuse more than the other toward the gate electrode.

4. A method as in claim 3 wherein, following the step of introducing second impurity, a step is performed comprising:
    heating the source and drain to cause one of the first and second impurities to diffuse into the first conductivity type semiconductor substrate beneath the spacer regions.

5. A method as in claim 4 wherein the first impurity comprises arsenic and the second impurity comprises phosphorus.

6. A method as in claim 5 wherein the step of introducing first impurity comprises introducing approximately $10^{15}$ atoms of arsenic per square centimeter and the step of introducing the second impurity comprises introducing approximately $10^{13}$ atoms of phosphorus per square centimeter.

7. A method as in claim 1 wherein following the step of using the gate electrode, a step is performed comprising:
    removing the spacer regions.

8. A method as in claim 7 wherein following the step of removing the spacer regions, a step is performed comprising:
    using the gate electrode as a mask introducing first impurity into the substrate.

9. A method as in claim 7 wherein following the step of removing the spacer regions, a step is performed comprising:
    using the gate electrode as a mask introducing second impurity into the substrate.

10. A method as in claim 1 wherein the step of defining a gate electrode comprises the steps of:
    forming a first layer of polycrystalline silicon;
    forming an overlying layer of a metal silicide; and
    removing all of the layers of polycrystalline silicon and metal silicide except where the gate electrode is desired.

11. A method as in claim 1 wherein the step of forming a first layer of insulating material on a first conductivity type semiconductor substrate comprises oxidizing a silicon substrate to form a layer of silicon dioxide.

12. A method as in claim 1 wherein the step of depositing an etch resistant layer comprises depositing a layer of silicon nitride.

13. A method as in claim 12 wherein the step of depositing an etchable layer comprises depositing a layer of silicon dioxide.

14. A method as in claim 13 wherein the step of removing the etchable layer comprises anisotropically etching the etchable layer.

15. A method as in claim 14 wherein the step of introducing first impurity of second conductivity type comprises ion implanting first impurity.

16. A method for fabricating a field effect transistor comprising:
    forming a gate insulating layer of silicon dioxide on a P conductivity type silicon semiconductor substrate;
    defining a gate electrode, including a lower polycrystalline silicon layer and an upper metal silicide layer, on the gate insulating layer, the gate electrode having an upper surface bounded by edges protruding about the gate insulating layer;
    depositing a silicon nitride layer over the gate electrode and over the gate insulating layer, the silicon nitride layer having edges conforming to the edges of the gate electrode;

depositing an etchable layer of silicon dioxide over the silicon nitride layer;

removing the etchable layer from the silicon nitride layer except for spacer regions disposed adjacent the edges of the silicon nitride layer;

using the gate electrode and the spacer regions of the etchable layer as a mask, introducing first impurity of n conductivity type into the substrate to define heavily doped portions of the spaced apart source and drain regions; and performing one of the following two steps:

using the gate electrode and the spacer regions as a mask, introducing second impurity of n conductivity type into the substrate, the first and second impurity having different diffusivity in silicon;

removing the spacer regions and using the gate electrode as a mask introducing n conductivity type impurity into the substrate.

* * * * *